(12) United States Patent
Wang et al.

(10) Patent No.: US 10,250,264 B2
(45) Date of Patent: Apr. 2, 2019

(54) MULTIPLYING DELAY-LOCKED LOOP USING SAMPLING TIME-TO-DIGITAL CONVERTER

(71) Applicant: Marvell World Trade Ltd., St. Michael (BB)

(72) Inventors: Haisong Wang, Crissier (CH); Olivier Burg, Lausanne (CH)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/629,427

(22) Filed: Jun. 21, 2017

(65) Prior Publication Data

US 2017/0366191 A1 Dec. 21, 2017

Related U.S. Application Data

(60) Provisional application No. 62/352,895, filed on Jun. 21, 2016.

(51) Int. Cl.
*H03L 7/06* (2006.01)
*H03L 7/081* (2006.01)
*H03L 7/091* (2006.01)

(52) U.S. Cl.
CPC ............ *H03L 7/0814* (2013.01); *H03L 7/091* (2013.01)

(58) Field of Classification Search
None
See application file for complete search history.

(56) References Cited

U.S. PATENT DOCUMENTS

| 6,952,431 B1 * | 10/2005 | Dally | H03L 7/083 370/503 |
| 8,237,475 B1 * | 8/2012 | Nagarajan | H03L 7/0805 327/141 |
| 8,384,456 B1 * | 2/2013 | Ramaswamy | H03L 7/0891 327/149 |

(Continued)

OTHER PUBLICATIONS

Du, Q.J., et al., "An Anti-Harmonic Locking, DLL Frequency Multiplier with Low Phase Noise and Reduced Spur", *IEEE 2006 Custom Integrated Circuits Conference (CICC'06)*, pp. 761-764, Sep. 10-13, 2006.

(Continued)

*Primary Examiner* — Lincoln D Donovan
*Assistant Examiner* — Khareem E Almo

(57) ABSTRACT

A multiplying delay-locked loop circuit includes a delay chain including a plurality of variable delay circuits connected in series and having a delay chain output, and a feedback loop including circuitry for deriving a digital control signal representing magnitude and sign of phase offset in the delay chain output, for controlling delay in ones of the variable delay circuits. The circuitry for deriving a digital control signal includes a sampling time-to-digital converter (STDC) configured to operate on a time delay between inputs to generate the digital control signal. The STDC subtracts a second difference the signals derived from the delay chain output and output of the feedback divider from a first difference between the signals derived from the delay chain output and output of the feedback divider to provide a difference value, and the difference value indicates sign and magnitude of output offset in the delay chain output.

20 Claims, 3 Drawing Sheets

(56) References Cited

U.S. PATENT DOCUMENTS

| | | | |
|---|---|---|---|
| 9,614,537 B1* | 4/2017 | Nandwana | H03L 7/24 |
| 9,906,358 B1* | 2/2018 | Tajalli | H04L 7/033 |
| 2007/0001724 A1* | 1/2007 | Na | H03L 7/0814 |
| | | | 327/158 |
| 2009/0179708 A1* | 7/2009 | Tamura | H03L 7/081 |
| | | | 331/34 |
| 2010/0271092 A1* | 10/2010 | Zerbe | G06F 13/4243 |
| | | | 327/161 |
| 2011/0109356 A1* | 5/2011 | Ali | H03L 7/0816 |
| | | | 327/158 |
| 2012/0074996 A1* | 3/2012 | Nagaraj | H03L 7/083 |
| | | | 327/157 |
| 2013/0154698 A1* | 6/2013 | Bottelli | H03L 7/07 |
| | | | 327/157 |
| 2015/0214965 A1* | 7/2015 | Odedara | H03L 7/07 |
| | | | 327/158 |
| 2015/0215110 A1* | 7/2015 | Chen | H03K 3/037 |
| | | | 375/362 |
| 2018/0083809 A1* | 3/2018 | Tajalli | H04L 25/40 |

OTHER PUBLICATIONS

Elkholy, A., et al., "A 6.75-to8.25GHz 2.25mW 190fs$_{rms}$ Integrated-Jitter PVT-Insensitive Injection-Locked Clock Multiplier Using All-Digital Continuous Frequency-Tracking Loop in 65nm CMOS", *2015 IEEE International Solid-State Circuits Conference (ISSCC 2015), Digest of Technical Papers, Session 10, Advanced Wireline Technologies and PLLs, 10.7*, pp. 188-190, Feb. 24, 2015.

Helal, B.M., et al., "A Highly Digital MDLL-Based Clock Multiplier That Leverages a Self-Scrambling Time-to-Digital Converter to Achieve Subpicosecond Jitter Performance", *IEEE Journal of Solid-State Circuits*, vol. 43, No. 4, pp. 855-863, Apr. 2008.

Kim, H., et al., "A 2.4GHz 1.5mW Digital MDLL Using Pulse-Width Comparator and Double Injection Technique in 27nm CMOS" *2016 IEEE International Solid-State Circuits Conference (ISSCC 2016), Digest of Technical Papers, Session 19, Digital PLLs, 19.3*, pp. 328-330, Feb. 3, 2016.

Maulik, P., et al., "A DLL-Based Programmable Clock Multiplier in 0.18-μm CMOS With—70 dBc Reference Spur", *IEEE Journal of Solid-State Circuits*, vol. 42, No. 8, pp. 1642-1648, Aug. 2007.

Ye, S. et al., "A Multiple-Crystal Interface PLL with VCO Realignment to Reduce Phase Noise", *2002 IEEE International Solid-State Circuits Conference, 2002 (ISSCC 2002), Digest of Technical Papers, Session 4, Backplane Interconnected ICs, 4.6*, 3 pgs., Feb. 4, 2002.

* cited by examiner

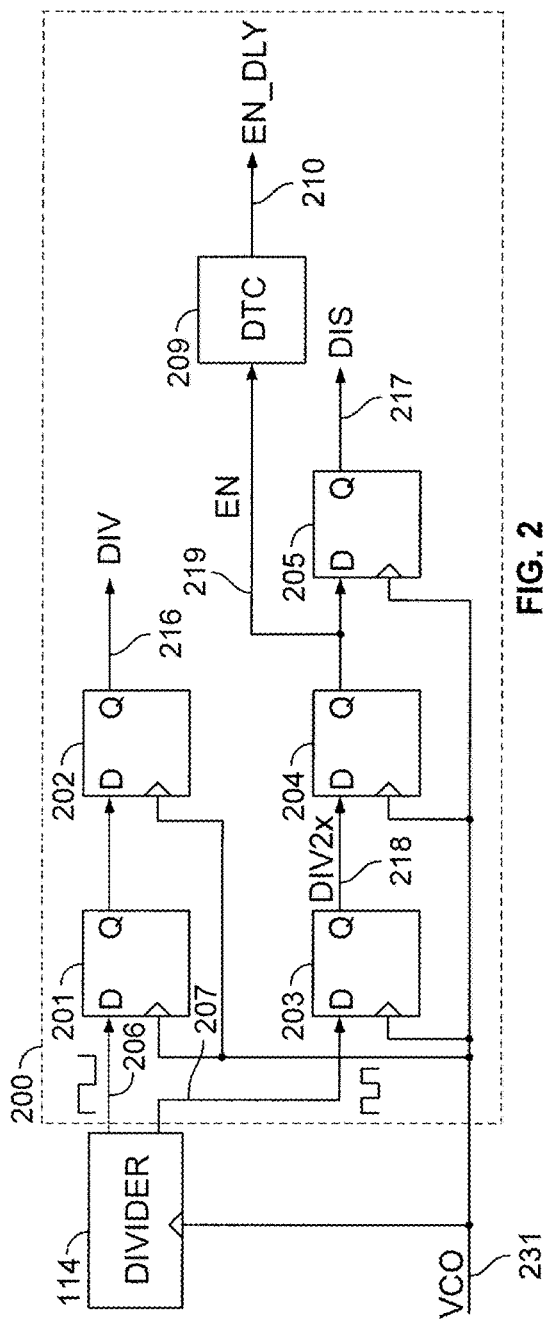
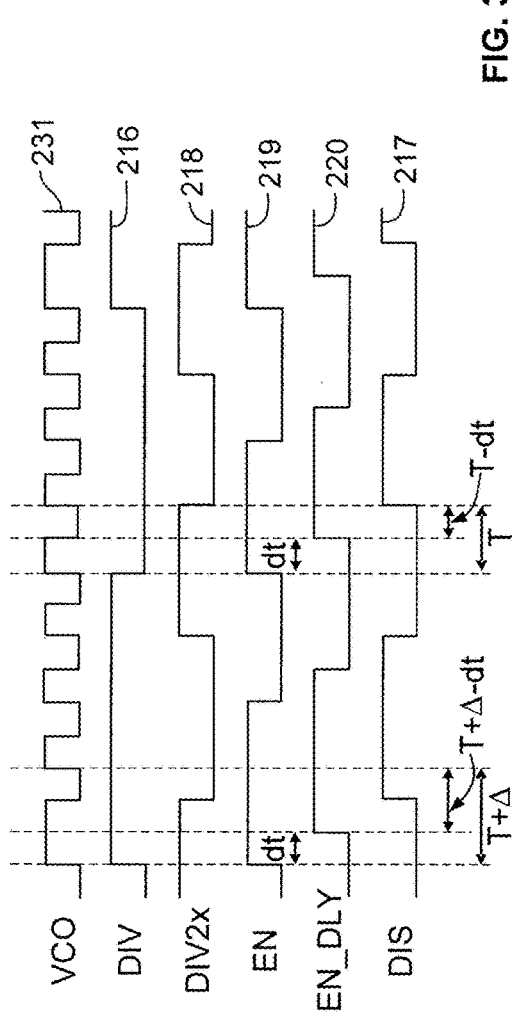

MULTIPLYING DELAY-LOCKED LOOP USING SAMPLING TIME-TO-DIGITAL CONVERTER

CROSS REFERENCE TO RELATED APPLICATION

This claims the benefit of commonly-assigned U.S. Provisional Patent Application No. 62/352,895, filed Jun. 21, 2016, which is hereby incorporated by reference herein in its entirety.

FIELD OF USE

This disclosure relates to a multiplying delay-locked loop using a sampling time-to-digital converter to control replacement of free-running edges of the delay-locked loop with edges of a reference signal.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

A delay-locked loop (DLL) may be used to lock a signal to a reference signal—i.e., to generate an output signal that has a constant delay relative to the phase of the input reference signal. In a basic delay-locked loop, the output of a variable delay chain (i.e., a chain of variable delays) is looped back to the input of a phase detector, which also has a reference signal as another input. The phase detector examines the phase difference between the looped delay chain output and the reference signal, and generates a control signal that adjusts the variable delays in the delay chain to align the phase of the delay chain output with the phase of the reference signal. Typically, the phase detector output merely indicates whether the delay chain output is ahead of or behind the reference signal and therefore whether the delay chain output should be retarded or advanced.

A multiplying delay-locked loop (MDLL) similarly uses a chain of variable delays, but the pulse edge of the reference signal (herein referred to as a "reference edge") is used to replace the edge of a free-running oscillator (e.g., a ring oscillator) within the DLL (herein referred to as a "free-running edge") at selected intervals (typically the selected interval corresponds to each period of the reference signal, which is normally longer than the period specified by the free-running oscillation frequency of the ring-oscillator—herein referred to as the "free-running period"—unless the multiplier N=1).

Replacing the edge of the MDLL output signal causes a perturbation of the output signal, as a rising or falling edge is moved from where it otherwise would have fallen. Such a perturbation is referred to as a "spur."

SUMMARY

A multiplying delay-locked loop circuit according to implementations of the subject matter of this disclosure includes a delay chain including a plurality of variable delay circuits connected in series and having a delay chain output, and a feedback loop including circuitry for deriving, from feedback signals supplied by the delay chain, a digital control signal representing magnitude and sign of phase offset in the delay chain output, for controlling delay in ones of the variable delay circuits in the plurality of variable delay circuits.

In one such implementation, the feedback loop further includes a feedback divider for dividing the delay chain output that is fed back for comparison to a reference signal, thereby multiplying output of the multiplying delay-locked loop circuit.

In a variant of such an implementation, the circuitry for deriving a digital control signal includes a sampling time-to-digital converter configured to operate on a time delay between inputs, including signals derived from the delay chain output and output of the feedback divider, to generate the digital control signal as an output.

In such a variant, the sampling time-to-digital converter subtracts a second difference between the one of the signals derived from the delay chain output and output of the feedback divider and the another of the signals derived from the delay chain output and output of the feedback divider, from a first difference between the one of the signals derived from the delay chain output and output of the feedback divider and the another of the signals derived from the delay chain output and output of the feedback divider, to provide a difference value, and the difference value indicates sign and magnitude of output offset in the delay chain output.

In such a variant, the feedback loop further includes an edge generator circuit that derives the signals derived from the delay chain output and output of the feedback divider.

In that variant, the edge generator circuit includes a plurality of flip-flops clocked by the delay chain output, where the plurality of flip-flops includes a first chain of flip-flops, the output of the feedback divider is input to the first chain of flip-flops, one of the signals derived from the delay chain output and the output of the feedback divider is an output of a final flip-flop in the first chain of flip-flops, and another of the signals derived from the delay chain output and the output of the feedback divider is a delayed output of an intermediate flip-flop in the first chain of flip-flops.

In that variant, the plurality of flip-flops may include a second chain of flip-flops, the output of the feedback divider may be input also to the second chain of flip-flops, the first difference may be taken on a rising edge of output of the second chain of flip-flops, and the second difference may be taken on a falling edge of the output of the second chain of flip-flops.

In that same variant the first chain of flip-flops may include three flip-flops, and the second chain of flip-flops may include two flip-flops. In such a variant, the intermediate flip-flop in the first chain of flip-flops may be the second flip-flop in the first chain of flip-flops.

In an alternative variant, the first chain of flip-flops may include three flip-flops. The intermediate flip-flop in the first chain of flip-flops may be the second flip-flop in the first chain of flip-flops.

In another variant, the delay chain includes an input multiplexer having, as a first multiplexer input, the delay chain output and, as a second multiplexer input, a reference signal, output of the input multiplexer is an input to the edge generator circuit, and the multiplying delay-locked loop circuit further comprises selection logic that controls output of the input multiplexer based on the output of the feedback divider and the output of the input multiplexer.

A wireless transceiver may including a multiplying delay-locked loop circuit according to implementations of the subject matter of this disclosure.

A method according to implementations of the subject matter of this disclosure for controlling a multiplying delay-locked loop circuit, where the multiplying delay-locked loop circuit includes a delay chain and having a delay chain output, and a feedback loop including a feedback divider for dividing the delay chain output, includes inputting, to a sampling time-to-digital converter, signals derived from (a) an output of a delay chain having a plurality of variable delay circuits that are connected in series and fed back in a feedback loop to input of the delay chain, and (b) an output of a feedback divider in the feedback loop, the feedback divider being configured to divide the delay chain output thereby multiplying output of the delay-locked loop circuit, and inputting an output signal of the sampling time-to-digital converter as a control signal to ones of the variable delay circuits in the plurality of variable delay circuits.

A variant of such a method may further include using an edge generator to derive the signals derived from the delay chain output and output of the feedback divider for input to the sampling time-to-digital converter.

In such a variant using the edge generator includes inputting the output of the feedback divider to a first chain of flip-flops, using an output of a final flip-flop in the first chain of flip-flops as one of the signals derived from the delay chain output and the output of the feedback divider, and using an output of an intermediate flip-flop in the first chain of flip-flops as another of the signals derived from the delay chain output and the output of the feedback divider.

Such a variant may further include using the sampling time-to-digital converter to subtract a second difference between the one of the signals derived from the delay chain output and output of the feedback divider and the another of the signals derived from the delay chain output and output of the feedback divider, from a first difference between the one of the signals derived from the delay chain output and output of the feedback divider and the another of the signals derived from the delay chain output and output of the feedback divider, to provide a difference value that indicates sign and magnitude of output offset in the delay chain output.

That variant may further include inputting the output of the feedback divider also to a second chain of flip-flops, taking the first difference on a rising edge of output of the second chain of flip-flops, and taking the second difference on a falling edge of the output of the second chain of flip-flops.

Another variant further includes selecting between a reference signal and the delay chain output as an input to the edge generator. In such a variant, the selecting is based on the delay chain output and the output of the feedback divider.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which;

FIG. 2 shows an implementation of an edge generator circuit used in an MDLL in accordance with the subject matter of this disclosure;

FIG. 3 represents waveforms of signals in the circuit of FIG. 2;

DETAILED DESCRIPTION

In an MDLL, when reference edges are used to replace free-running edges of a ring oscillator, a spur, which may be a significant noise or harmonic distortion component, occurs when an imposed rising or falling edge of the reference signal does not coincide with an existing rising or falling edge of the free-running MDLL output signal. This will frequently be the case, or it would not be necessary to replace the edge in the first place. However, the further the imposed edge is from the existing edge, the worse the spur.

Known circuits—e.g., using phase detectors—generate only an advance or retard signal, advancing or retarding the output signal without regard to the degree of mismatch between the output signal and the reference signal. Some attempts have been made to measure the degree of mismatch and to modulate the advance or retard signal based on that degree of mismatch which could reduce spurs, but the measurements have not been of sufficiently fine resolution to significantly reduce spurs. For example, one attempt used a gated ring oscillator to measure the degree of mismatch. However, the resolution of a gated ring oscillator may be on the order of lops, which is not fine enough relative to the phase error which may be on the order of 1 ps or less.

In accordance with implementations of the subject matter of this disclosure, a sampling time-to-digital converter ("sampling TDC" or "STDC") is used in the feedback loop of an MDLL to generate a phase-error correction signal with includes both sign (advance or retard) and magnitude. An STDC may be coupled to an edge generator, and configured to compare signals that represent the reference edge and the free-running edge to generate an output, such as a phase-error correction signal that represents the phase difference between the reference edge and the free-running edge. The phase-error correction signal is then configured to be fed back to the input of the MDLL to compensate for the edge difference. An STDC can have a resolution of less than 1 ps. As a result, an STDC-based MDLL has improved (i.e., reduced) spur performance and faster convergence. Moreover, in some implementations the sub-picosecond resolution eliminates the need for loop filtering because the fast convergence of MDLL output results in relatively insignificant harmonic noise components, which lowers power consumption.

Figure 1:
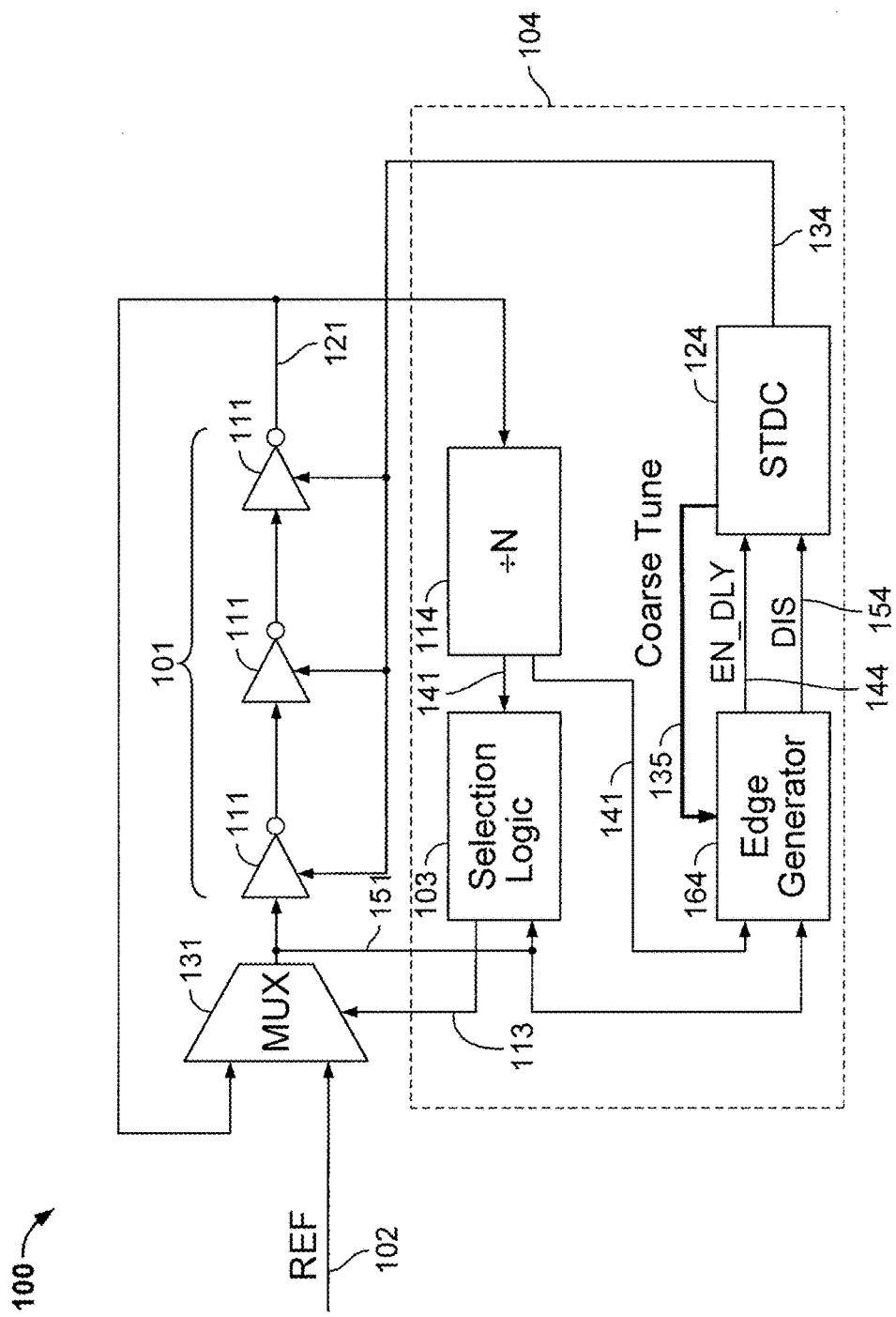
FIG. 1 shows an implementation of an MDLL in accordance with the subject matter of this disclosure.

One implementation of an MDLL 100 in accordance with the subject matter of this disclosure is shown in FIG. 1. MDLL 100 includes a plurality of delays 111 arranged as a delay chain 101. Output signal 121 of delay chain 101 is fed back to input multiplexer 131, whose other input is reference signal 102. Multiplexer 131 is controlled by signal 113 from selection logic 103.

Output signal 121 of delay chain 101 is fed back in a control loop 104 that includes a divide-by-N feedback divider 114, although N=1 is possible. The divide-by-N feedback divider 114 is configured to generate a feedback signal. 141 that has a frequency of the loop output signal 121 divided by N, thus creating a frequency synthesizer for the MDLL 100 to generate a different frequency from a single reference frequency. If N≠1, division of the feedback signal in control loop 104 results in output signal 121 having a frequency equal to the frequency of reference signal 102 multiplied by N. Divided fed-back output signal 141 is one of the inputs to selection logic 103 that controls input multiplexer 131. The output of input multiplexer 131 is the other input to selection logic 103.

Selection logic 103 is configured, by default, to selects the feedback input of multiplexer 131 as output 151, so that selection logic 103 is almost always comparing the fed-back output signal 121 to the divided fed-back output signal 141. Alternatively, when multiplexer 131 outputs reference signal 102, selection logic 103 is configured to compare the divided fed-back signal 141 with reference signal 102. For example, whenever a rising edge of the divided fed-back output signal 141 is "close to" a rising edge of fed-back output signal 121 (e.g., no further from a rising edged of fed-back output signal 121 than one period of signal 121), the output of selection logic 103 (i.e., control signal 113) may consequently be "close to" a value of '1'. As output 151 is the result of multiplexing reference signal 102 and loop output 121 under control of control signal 103, selection logic 103 will select input reference signal 102 in response to control signal 103 being "close to" a value of '1'. This happens every N periods of fed-back output signal 121 which is every period of input reference signal 102. Thus, even when fed-back output signal 121 has a "dirty" rising edge—i.e., an irregularly rising "slope" instead of a sharp rising edge of a square-shaped pulse—due to noise components (i.e., spurs), the rising edge of fed-back output signal 121 is transformed into, and thus is represented by, the "clean" rising edge of reference signal 102—e.g., a sharp rising edge of a square-shaped pulse.

Control loop 104 also includes STDC 124 which generates the phase error correction signal 134 that controls each of delays 111 in delay chain 101. STDC 124 is configured to compare and obtain a time delay between two input signals (e.g., signals 144 and 154) and convert the time delay into a digital output (e.g., signal 134) representing the phase difference between the two input signals. One possible implementation of an STDC that may be used as STDC 124 is shown in copending, commonly-assigned U.S. patent application Ser. No. 15/370,796, filed Dec. 6, 2016, which is hereby incorporated by reference herein in its entirety. For example, STDC 124 subtracts signal 144, indicative of edge information of divided fed-back signal 141, from signal 154, indicative of a reference edge, to generate phase error correction signal 134 which represents the magnitude and direction (i.e., sign) of the error between output signal 121 and reference signal 102.

Signal 144 and signal 154 are generated by edge generator 164 whose inputs include the same inputs as selection logic 103—i.e., divided fed-back output signal 141 and the output 231 of input multiplexer 131. One implementation 200 of edge generator 164 is shown in FIG. 2, and includes five flip-flops 201-205. Each of flip-flops 201-205, as well as feedback divider 114, is clocked by the output 231 of input multiplexer 131 (labelled "VCO" in FIGS. 2 and 3). Divider output 206 passes through flip-flops 201 and 202 to provide DIV signal 216. Divider output 207, having twice the frequency of divider output 206, passes through flip-flops 203, 204 and 205 to provide disable (DIS) signal 217. The output of flip-flop 203 is double-divided (DIV2×) signal 218. The output of flip-flop 204 is enable (EN) signal 219. Digital-to-time conversion of EN signal 218 at 208 yields delayed enable (EN_DLY) signal 220.

The relationships of the various signals in the circuit of FIG. 2 are shown in FIG. 3. As seen, at each rising edge of DIV signal 216, representing one complete cycle of VCO signal 231, the 'ON' portion of the first period of VCO signal 231 is lengthened from its normal period T to T+Δ, where Δ represents the perturbation caused by the imposed phase error correction. At each falling edge of DIV signal 216, VCO signal 231 has its normal period T.

Perturbation Δ can be determined by subtracting T from T+Δ. However, if dt is the delay between EN signal 219 and EN_DLY signal 220, it can be seen from FIG. 3 that perturbation Δ also can be determined by subtracting T−dt from T+Δ−dt. That is, the difference between EN_DLY 144 and DIS 154 on the falling edge of DIV is subtracted from the difference between EN_DLY and DIS on the rising edge of DIV. "Zooming in" on the error to start with these smaller quantities for the subtraction increases the resolution of the result, without using conventional approaches such as a loop filter to filter the noise components. In this way, power consumption may be reduced. The subtraction T+Δ−dt−(T−dt)=Δ is performed in STDC 124, where the differences, at two different times determined by rising and falling edges of DIV signal 216, between the inputted time durations of DIS signal 217 and EN_DLY signal 219 (shown in FIG. 3) are converted to a digital (binary) value that is error correction signal 134, to control delays 111 in delay chain 101.

In STDC 124, depending on how close the detected edges of signals 144 and 154 are to each other, STDC output 134 may have a saturated maximum value or a saturated minimum value. Coarse tune signal 135, which is derived during calibration of the MDLL by observing the saturated maximum value and the saturated minimum value, is applied to edge generator 164 to bring STDC output 134 closer to a midpoint between the maximum and minimum saturation levels.

Figure 4:
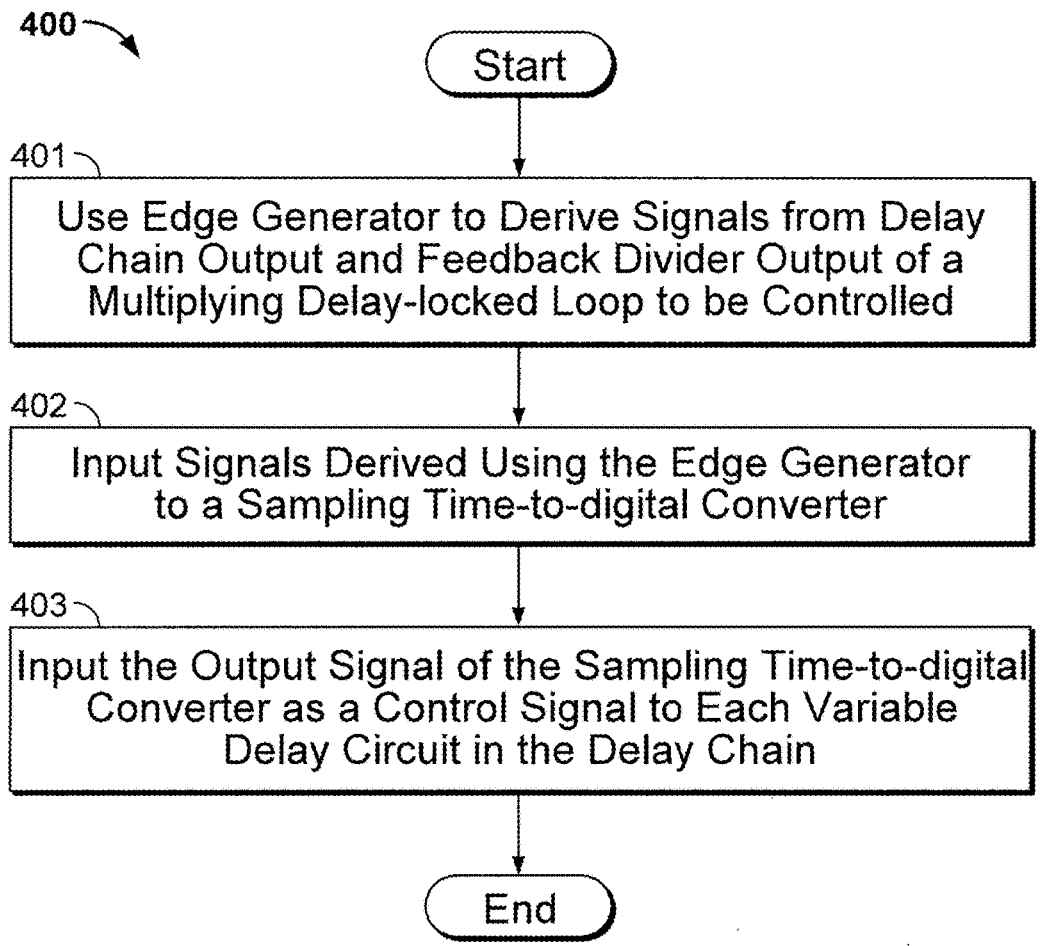
FIG. 4 is a flow diagram of an implementation of a method according to the subject matter of this disclosure for controlling an MDLL.

An implementation of a method 400 according to the subject matter of this disclosure is diagrammed in FIG. 4. At 401, an edge generator is used to derive signals from the delay chain output and the feedback divider output of a multiplying delay-locked loop to be controlled. At 402, the signals derived using the edge generator are input to a sampling time-to-digital converter. At 403, the output signal of the sampling time-to-digital converter is input as a control signal to each variable delay circuit in the delay chain.

Figure 5:
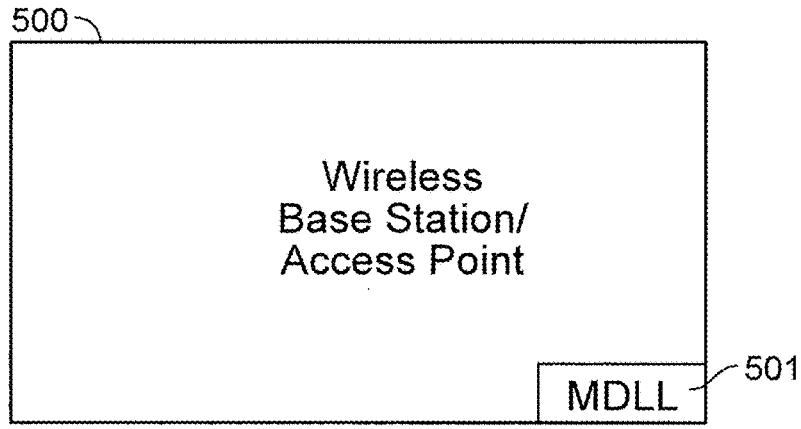
FIG. 5 is a block diagram of an implementation of a wireless transceiver such as a WiFi base station or access point.

Thus, the apparatus and/or methods described above provide an MDLL with sub-picosecond resolution by utilizing an STDC to fine tune the delay chain of the MDLL. The resulting sub-picosecond resolution provides relatively insignificant noise components and thus fast convergence of the MDLL output. Power consumption is also reduced as loop filtering to filter noise components may be omitted from the MDLL. Such an MDLL may be used anywhere that clock generation is required. For example, such an MDLL 501 can be used in a wireless transceiver such as a WiFi base station or access point 500 (FIG. 5), in place of a ring-oscillator-based analog phase-locked loop, providing better phase noise performance for the same power.

As used herein and in the claims which follow, the construction "one of A and B" shall mean "A or B."

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A multiplying delay-locked loop circuit, comprising:
a delay chain including a plurality of variable delay circuits connected in series and having a delay chain output; and
a feedback loop including circuitry for deriving, from feedback signals supplied by the delay chain, a digital control signal representing magnitude and sign of phase offset in the delay chain output, for controlling delay in ones of the variable delay circuits in the plurality of variable delay circuits, the circuitry for deriving a digital control signal comprising a sampling time-to-digital converter configured to operate on a time delay between inputs to generate the digital control signal as an output.

2. The multiplying delay-locked loop circuit of claim 1, wherein the feedback loop further comprises a feedback divider for dividing the delay chain output that is fed back for comparison to a reference signal, thereby multiplying output of the multiplying delay-locked loop circuit.

3. The multiplying delay-locked loop circuit of claim 2, wherein the sampling time-to-digital converter is configured to operate on signals derived from the delay chain output and output of the feedback divider, to generate the digital control signal as an output.

4. The multiplying delay-locked loop circuit of claim 3, wherein:
the sampling time-to-digital converter subtracts a second difference between the one of the signals derived from the delay chain output and output of the feedback divider and the another of the signals derived from the delay chain output and output of the feedback divider, from a first difference between the one of the signals derived from the delay chain output and output of the feedback divider and the another of the signals derived from the delay chain output and output of the feedback divider, to provide a difference value; and
the difference value indicates sign and magnitude of output offset in the delay chain output.

5. The multiplying delay-locked loop circuit of claim 3, wherein the feedback loop further comprises an edge generator circuit that derives the signals derived from the delay chain output and output of the feedback divider.

6. The multiplying delay-locked loop circuit of claim 5, wherein the edge generator circuit comprises:
a plurality of flip-flops clocked by the delay chain output; wherein:
the plurality of flip-flops includes a first chain of flip-flops;
the output of the feedback divider is input to the first chain of flip-flops;
one of the signals derived from the delay chain output and the output of the feedback divider is an output of a final flip-flop in the first chain of flip-flops; and
another of the signals derived from the delay chain output and the output of the feedback divider is a delayed output of an intermediate flip-flop in the first chain of flip-flops.

7. The multiplying delay-locked loop circuit of claim 6, wherein:
the plurality of flip-flops includes a second chain of flip-flops;
the output of the feedback divider is input also to the second chain of flip-flops;
the first difference is taken on a rising edge of output of the second chain of flip-flops; and
the second difference is taken on a falling edge of the output of the second chain of flip-flops.

8. The multiplying delay-locked loop circuit of claim 7, wherein:
the first chain of flip-flops includes three flip-flops; and
the second chain of flip-flops includes two flip-flops.

9. The multiplying delay-locked loop circuit of claim 8, wherein the intermediate flip-flop in the first chain of flip-flops is the second flip-flop in the first chain of flip-flops.

10. The multiplying delay-locked loop circuit of claim 6, wherein the first chain of flip-flops includes three flip-flops.

11. The multiplying delay-locked loop circuit of claim 10, wherein the intermediate flip-flop in the first chain of flip-flops is the second flip-flop in the first chain of flip-flops.

12. The multiplying delay-locked loop circuit of claim 5, wherein:
the delay chain includes an input multiplexer having, as a first multiplexer input, the delay chain output and, as a second multiplexer input, a reference signal;
output of the input multiplexer is an input to the edge generator circuit; and
the multiplying delay-locked loop circuit further comprises selection logic that controls output of the input multiplexer based on the output of the feedback divider and the output of the input multiplexer.

13. A wireless transceiver including the multiplying delay-locked loop circuit of claim 1.

14. A method of controlling a multiplying delay-locked loop circuit, the multiplying delay-locked loop circuit including a delay chain and having a delay chain output, and a feedback loop including a feedback divider for dividing the delay chain output, the method comprising:
inputting, to a sampling time-to-digital converter, signals derived from (a) an output of a delay chain having a plurality of variable delay circuits that are connected in series and fed back in a feedback loop to input of the delay chain, and (b) an output of a feedback divider in the feedback loop, the feedback divider being configured to divide the delay chain output thereby multiplying output of the delay-locked loop circuit; and
inputting an output signal of the sampling time-to-digital converter as a control signal to ones of the variable delay circuits in the plurality of variable delay circuits.

15. The method of claim 14, further comprising using an edge generator to derive the signals derived from the delay chain output and output of the feedback divider for input to the sampling time-to-digital converter.

16. The method of claim 15, wherein using the edge generator comprises:
inputting the output of the feedback divider to a first chain of flip-flops;
using an output of a final flip-flop in the first chain of flip-flops as one of the signals derived from the delay chain output and the output of the feedback divider; and
using an output of an intermediate flip-flop in the first chain of flip-flops as another of the signals derived from the delay chain output and the output of the feedback divider.

17. The method of claim 16, further comprising using the sampling time-to-digital converter to subtract a second difference between the one of the signals derived from the delay chain output and output of the feedback divider and the another of the signals derived from the delay chain output and output of the feedback divider, from a first difference between the one of the signals derived from the delay chain output and output of the feedback divider and the another of the signals derived from the delay chain output and output of the feedback divider, to provide a difference value that indicates sign and magnitude of output offset in the delay chain output.

18. The method of claim 17, further comprising:
- inputting the output of the feedback divider also to a second chain of flip-flops;
- taking the first difference on a rising edge of output of the second chain of flip-flops; and
- taking the second difference on a falling edge of the output of the second chain of flip-flops.

19. The method of claim 15, further comprising selecting between a reference signal and the delay chain output as an input to the edge generator.

20. The method of claim 19 wherein the selecting is based on the delay chain output and the output of the feedback divider.

* * * * *